(12) United States Patent (10) Patent No.: US 7,759,222 B2
Morii et al. (45) Date of Patent: Jul. 20, 2010

(54) SOLID-STATE IMAGING DEVICE AND METHOD FOR FABRICATING THE SAME

(75) Inventors: Chie Morii, Kyoto (JP); Sougo Ohta, Osaka (JP)

(73) Assignee: Panasonic Corporation, Osaka (JP)

( * ) Notice: Subject to any disclaimer, the term of this patent is extended or adjusted under 35 U.S.C. 154(b) by 104 days.

(21) Appl. No.: 11/905,787

(22) Filed: Oct. 4, 2007

(65) Prior Publication Data

US 2008/0087976 A1   Apr. 17, 2008

(30) Foreign Application Priority Data

Oct. 11, 2006   (JP) .............................. 2006-277942

(51) Int. Cl.
*H01L 27/146* (2006.01)
*H01L 21/00* (2006.01)
(52) U.S. Cl. .................. 438/462; 257/446; 257/E27.3; 257/E27.31; 438/59
(58) Field of Classification Search ................. 257/446, 257/E27.131, E27.13; 438/59, 462
See application file for complete search history.

(56) References Cited

U.S. PATENT DOCUMENTS

| 6,063,702 | A  | * | 5/2000  | Chung   | 438/624 |
| 6,306,755 | B1 | * | 10/2001 | Zheng   | 438/631 |
| 6,333,221 | B1 | * | 12/2001 | Lee     | 438/239 |
| 6,433,438 | B2 | * | 8/2002  | Koubuchi et al. | 257/776 |
| 7,009,233 | B2 | * | 3/2006  | Uchiyama et al. | 257/296 |
| 2002/0157076 | A1 | * | 10/2002 | Asakawa | 716/10 |
| 2003/0166322 | A1 | * | 9/2003  | Kasuya  | 438/284 |
| 2008/0128924 | A1 | * | 6/2008  | Liu et al. | 257/797 |

FOREIGN PATENT DOCUMENTS

| EP | 1912258 A2 | * | 4/2008 |
| JP | 09-102539  |   | 4/1997 |
| JP | 09102539 A | * | 4/1997 |

* cited by examiner

*Primary Examiner*—Zandra Smith
*Assistant Examiner*—Jeremy J Joy
(74) *Attorney, Agent, or Firm*—McDermott Will & Emery LLP

(57) ABSTRACT

A method for fabricating a solid-state imaging device comprises: a step of forming a photodiode protection insulation film 6a; a step of forming a dummy protection insulation film 6c corresponding to the photodiode protection insulation film 6a both in the peripheral circuit region 1b and the scribe lane region 1c; and a step of forming an interlayer insulation film 9 for covering all three regions of a pixel region 1a in which pixels and the photodiode protection insulation film 6a are formed, a peripheral circuit region 1b in which a driving circuit and the dummy protection insulation film 6c are formed, and a scribe lane region 1c in which the dummy protection insulation film 6c is formed, wherein the dummy protection insulation film 6c causes an average height of a surface of the interlayer insulation film 9 included in each of the peripheral circuit region 1b and the scribe lane region 1c to be close to an average height of a surface of the interlayer insulation film 9 included in the pixel region 1a, before a CMP is performed on an entirety of the surface thereof.

8 Claims, 11 Drawing Sheets

SOLID-STATE IMAGING DEVICE AND METHOD FOR FABRICATING THE SAME

BACKGROUND OF THE INVENTION

1. Field of the Invention

The present invention relates to a solid-state imaging device having a pixel region, a peripheral circuit region and a scribe lane region on the same semiconductor chip and a method for fabricating the same. More particularly, the present invention relates to a solid-state imaging device in which dummy patterns are provided in a peripheral circuit region and a scribe lane region and a method for fabricating the same.

2. Description of the Background Art

In the field of semiconductor integrated circuits, while a microfabrication of the semiconductor integrated circuit progresses, advancements have also been made to develop a device having a special function such as a solid-state imaging device. For example, in a solid-state imaging device called as a CMOS image sensor, an integrated circuit different from a commonly used integrated circuit is provided. On a main surface of a semiconductor substrate, such an integrated circuit different from the commonly used one has a pixel region, a peripheral circuit region which is provided around the periphery of the pixel region and composed of various logic circuits such as a pixel scanning circuit and a pixel signal processing circuit, and a scribe lane region which is provided around the periphery of the peripheral circuit region. These regions are integrally formed on one semiconductor chip, that is, on the same semiconductor chip. In recent years, in such a solid-state imaging device, as a size of a semiconductor chip is reduced and the number of pixels used in the solid-state imaging device is increased, a wiring portion, in particular, has been microfabricated accordingly. For microfabricating the commonly used integrated circuit and solid-state imaging device, a technology for planarizing a surface of an interlayer insulation film such as a CMP (Chemical Mechanical Polishing) is utilized.

In the solid-state imaging device, a gate electrode of an electrical charge reading transistor is provided on a silicon substrate, and an interlayer insulation film is provided over the entirety of a chip so as to cover the gate electrode therewith. A surface of the interlayer insulation film needs to be formed flat. Conventionally, in order to form the flat surface, the CMP is adopted to reduce a local level difference on a surface of each fine pattern. However, a problem still lies in a level difference on the surface of the interlayer insulation film covering the entirety of the chip (i.e., a global level difference). The global level difference is a level difference, on the surface of the interlayer insulation film, existing from a center portion to peripheral portion of the chip when viewed from the perspective of the entirety of the chip as a whole.

FIG. 8 is a diagram illustrating an exemplary global level difference of a conventional solid-state imaging device. In FIG. 8(a), the pixel region, the peripheral circuit region located around the periphery of the pixel region and the scribe lane region located around periphery of the peripheral circuit region are disposed on the surface of the chip. FIGS. 8(b) and (c) are cross-sectional views along lines Xa-Xb and Ya-Yb of FIG. 8(a), respectively, each of which illustrating a measurement result of a height distribution of a surface of a BPSG (Boron Phosphorous Silicate Glass) film after the CMP is performed on the surface thereof. The BPSG film is an interlayer insulation film (a contact layer). This measurement result shows that a height of the surface of the BPSG film is the greatest at the center portion of the chip (i.e., a center portion of the pixel region), and is the lowest at the peripheral portion of the chip (i.e., a peripheral portion of the scribe lane region).

The global level difference is generated since a polishing rate of the BPSG film is different among the three regions. Specifically, the polishing rate of the BPSG film is high in the peripheral circuit region and the scribe lane region, and low in the pixel region. During the CMP, these three regions are simultaneously polished by means of a single polishing pad. Therefore, a high polishing rate in the peripheral circuit region exerts an influence on the polishing rate in the pixel region. Thus, in the pixel region, the polishing rate becomes gradually higher from its center portion to peripheral portion. As a result, as shown in FIG. 8, the height of the surface of the BPSG film included in the pixel region becomes gradually lower from its center portion to peripheral portion after the CMP is performed on the surface thereof.

As described above, the polishing rate of the BPSG film is high in the peripheral circuit region and the scribe lane region, and low in the pixel region. This is because an area in which the interlayer insulation film is to be polished is small in the peripheral circuit region and the scribe lane region, and large in the pixel region. The larger the area in which the interlayer insulation film is to be polished is, the smaller the polishing rate (a polishing speed) tends to become.

Conventionally, the area in which the interlayer insulation film is to be polished is small in the peripheral circuit region and the scribe lane region, and large in the pixel region. The reason therefor will be described below. In the solid-state imaging device comprising the pixel region, the peripheral circuit region and the scribe lane region, all of which are provided on the same semiconductor chip, a pattern density occupied by a gate electrode is higher in the pixel region than in the peripheral circuit region or the scribe lane region.

Furthermore, a photodiode is provided in the pixel region. On the photodiode, an insulation film is provided so as to protect the photodiode from plasma used when a side wall is formed for a pixel driving MOS transistor which is provided in the peripheral circuit region. On the contrary, the plasma exerts little influence on a source region and a drain region of the pixel driving MOS transistor provided in the peripheral circuit region. No MOS transistor is provided in the scribe lane region. Therefore, the insulation film for protecting the source region of the MOS transistor is not necessarily needed in the peripheral circuit region and the scribe lane region. After the insulation film for protecting the photodiode is provided, the interlayer insulation film is provided over the entirety of the chip so as to cover the insulation film therewith. In order to planarize the surface of the interlayer insulation film, the CMP is performed on the surface thereof.

A height of the surface of the interlayer insulation film included in the pixel region, where the insulation film for protecting the photodiode is provided and the pattern density occupied by the gate electrode is high, is greater than that of the interlayer insulation film included in each of other two regions, where no insulation film for protecting the photodiode is provided and the pattern density occupied by the gate electrode is low. Therefore, the pixel region has a larger area of the interlayer insulation film on which the CMP needs to be performed than the other two regions. In this case, the polishing rate in the pixel region becomes higher than that in the peripheral circuit region or the scribe lane region. As described above, the high polishing rate in the peripheral circuit region exerts an influence on the polishing rate in the pixel region. Thus, after the CMP is performed on the surface of the interlayer insulation film, the height of the surface thereof included in the pixel region is the greatest at its center portion, and the lowest at its peripheral portion. In other words, the global level difference is generated in the pixel region. When the global level difference exists in the pixel region, a distance between a photodiode, acting as a photoreceptor for converting an optical signal into an electrical signal, and a condenser microlens, provided above the photodiode with the interlayer insulation film therebetween, becomes larger at its center portion and smaller at its peripheral portion. This may cause a shading phenomenon in which an intensity of light incident to the photodiode is different between the central portion of the pixel region and the peripheral portion thereof.

As described above, when the global level difference is generated in the pixel region, shading is caused. As a result, a sensitivity to incident light and an incident angle characteristic are deteriorated. Thus, it is necessary to reduce the global level difference to a minimum.

A detailed example of the conventional solid-state imaging device in which such a global level difference is generated will be described with reference to the drawings. FIGS. 9 and 10 are diagrams illustrating steps of a method for fabricating the conventional solid-state imaging device. Each of FIGS. 9 and 10 shows cross sections of a pixel region 11a, a peripheral circuit region 11b and a scribe lane region 11c, all of which are provided in the solid-state imaging device. The step shown in FIG. 10(a) is a step subsequent to the step shown in FIG. 9(d).

Hereinafter, the method for fabricating the conventional solid-state imaging device will be described.

Firstly, on a semiconductor substrate in which a photodiode 13 and a STI (Shallow Trench Isolation) 12 are formed, a polysilicon 14 is deposited (FIG. 9(a)). Then, the polysilicon 14 is selectively etched so as to form gate electrodes 14a and 14b of MOS transistors (FIG. 9(b)). In the peripheral circuit region 11b, a low concentration impurity diffusion layer 15 having a LDD (Lightly Doped Drain) structure is formed in order to alleviate an electrical field in the vicinity of a drain region of the MOS transistor (FIG. 9(c)). Over the entirety of the semiconductor substrate, a TEOS (Tetra Ethyl Ortho Silicate) film 16 acting as an insulation film is deposited (FIG. 9(d)). Thereafter, in order to form a side wall spacer 16b made of the TEOS film 16 in the peripheral circuit region 11b, an etchback is performed by a strong anisotropic etching using plasma in the peripheral circuit region 11b (FIG. 10(a)). At this time, in the pixel region 11a, the TEOS film 16a is caused to remain on the photodiode 13 such that the photodiode 13 is not damaged by the plasma. In order to cause the TEOS film 16a to remain on the photodiode 13, a photo resist film which is not shown is formed on the TEOS film 16 corresponding to a position at which the photodiode 13 is located. The photo resist film is removed after forming the side wall spacer 16b. The characteristic of a fabrication process of the solid-state imaging device is that the TEOS film 16a is caused to remain on the photodiode 13.

Next, a high concentration source/drain diffusion layer 17 is formed (FIG. 10(b)). Further, through an opening formed by removing the TEOS film 16 due to the etching, a metal silicide layer 18 is formed on upper portions of the gate electrodes 14a and 14b (FIG. 10(b)). Thereafter, a BPSG film 19 is formed over the entirety of the semiconductor substrate such that the gate electrodes 14a and 14b and the TEOS films 16a and 16b are to be buried thereunder (FIG. 10(c)). Note that in the scribe lane region 11c, neither the gate electrode nor the TEOS film exists. Therefore, the pattern density occupied by the gate electrode is higher in the order of the pixel region 11a, the peripheral circuit region 11b and the scribe lane region 11c. Furthermore, the insulation film 16a for protecting the photodiode 13 remains in the pixel region 11a. Therefore, among the pixel region 11a, the peripheral circuit region 11b and the scribe lane region 11c, the pixel region 11a has the greatest average height of the surface of the BPSG film 19. Thus, among the pixel region 11a, the peripheral circuit region 11b and the scribe lane region 11c, the pixel region 11a also has the largest area in which the BPSG film 19 needs to be polished. However, if the CMP is performed on the surface of the BPSG film 19 in this state, the polishing rate obtained by the CMP is lower in the order of the pixel region 11a, the peripheral circuit region 11b and the scribe lane region 11c. As a result, after the CMP is performed on the surface of the BPSG film 19, a global level difference 110 is generated at boundary portions between the three regions (FIG. 10(d)). For schematically showing the global level difference, in FIG. 10(d), each of the three regions is flat and a level difference exits at the boundary portions between the regions. In practice, however, as shown in FIG. 8, the surface of the BPSG film 19 included in each of the pixel region, the peripheral circuit region and the scribe lane region is slanted, and the height of the surface of the BPSG film 19 becomes gradually lower from the center position of the pixel region to the peripheral portion of the scribe lane region.

As an exemplary technique for planarizing a surface of an insulation film of a solid-state imaging device, there is a technique disclosed in Japanese Laid-Open Patent Publication No. 9-102539 (see FIG. 11). However, this technique is used only for planarizing a surface of a device isolation region 14X formed on a surface of the semiconductor substrate 11X, and is not used for planarizing the surface of the interlayer insulation film.

SUMMARY OF THE INVENTION

As described above, conventionally, when fabricating the solid-state imaging device, there is no technique capable of substantially reducing the global level difference on the surface of the interlayer insulation film.

In view of the present situation, an object of the present invention is to provide a method for fabricating a solid-state imaging device capable of substantially reducing, after a CMP is performed on a surface of an interlayer insulation film formed on a gate electrode and its wiring, a global level difference on the surface of the interlayer insulation film, by providing dummy patterns in a peripheral circuit region and scribe lane region of a chip, thereby producing an excellent flatness across the surface of the interlayer insulation film after the CMP is performed on the surface thereof, and thus to realize a micro cell image sensor having an excellent sensitivity and excellent incident angle characteristic.

A method for fabricating a solid-state imaging device according to the present invention comprising, on a main surface of a semiconductor substrate, a pixel region, a peripheral circuit region located around a periphery of the pixel region, and a scribe lane region located around the periphery of the peripheral circuit region, the method comprises: a step of forming pixels in the pixel region; a step of forming a driving circuit for driving the pixels in the peripheral circuit region; a step of forming a photodiode protection insulation film for protecting a photodiode acting as a component of each of the pixels on the main surface of the semiconductor substrate; a step of forming a dummy protection insulation film corresponding to the photodiode insulation film both in the peripheral circuit region and the scribe lane region; a step of forming an interlayer insulation film for covering three regions of the pixel region in which the pixels and the photodiode protection insulation film are formed, the peripheral circuit region in which the driving circuit and the dummy protection insulation film are formed, and the scribe lane region, for separating an integrated circuit region including the pixel region and the peripheral circuit region from an adjacent integrated circuit region, in which the dummy protection insulation film is formed; and a step of performing a CMP (Chemical Mechanical Polishing) on an entirety of a surface of the interlayer insulation film, wherein the dummy protection insulation film causes an average height of the surface of the interlayer insulation film included in each of the peripheral circuit region and the scribe lane region to be close to an average height of the surface of the interlayer insulation film included in the pixel region, before the CMP is performed on the entirety of the surface thereof.

According to the present invention, the dummy protection insulation film causes the average height of the surface of the interlayer insulation film included in each of the peripheral circuit region and the scribe lane region to be close to the average height of the surface of the interlayer insulation film included in the pixel region, before the CMP is performed on the entirety of the surface thereof. Therefore, the average heights of the surfaces of the interlayer insulation film included in the regions, each having a different wiring density, can be nearly equivalent to each other, and thus a polishing rate of the interlayer insulation film can be nearly equivalent accordingly among the regions, each having the different wiring density. When the polishing rate of the interlayer insulation film is nearly equivalent among the regions, each having the different wiring density, a global level difference between the three regions, each having the different wiring density, can be reduced after the CMP is performed on the entirety of the surface of the interlayer insulation film. Furthermore, when the polishing rate of the interlayer insulation film is nearly equivalent among the regions, each having the different wiring density, an influence exerted on the polishing rate in the pixel region by the polishing rate in the peripheral circuit region can be suppressed, thereby making it possible to reduce the global level difference in the pixel region. By reducing the global level difference, it becomes possible to realize a microfabrication of a wiring portion of a cell and a miniaturization of the cell as well as an image sensor having a higher resolution.

It is preferable that the dummy protection insulation film causes the average heights of the surfaces of the interlayer insulation film included in at least any two of the three regions of the pixel region, the peripheral circuit region and the scribe lane region to be nearly equivalent to each other, before the CMP is performed on the entirety of the surface thereof.

With such a structure, it becomes possible to assuredly suppress an occurrence of the global level difference.

According to the present invention, it is preferable that the method for fabricating the solid-state imaging device further comprises a step of forming on the main surface of the semiconductor substrate a dummy gate electrode not functioning as a transistor in either at least one of the peripheral circuit region and the scribe lane region, wherein the interlayer insulation film further covers the dummy gate electrode, and the dummy gate electrode causes the average height of the surface of the interlayer insulation film included in each of the peripheral circuit region and the scribe lane region to be close to the average height of the surface of the interlayer insulation film included in the pixel region, before the CMP is performed on the entirety of the surface thereof.

With such a structure, the occurrence of the global level difference can be easily suppressed.

According to the present invention, it is also preferable that the dummy protection insulation film and the dummy gate electrode cause the average heights of the surfaces of the interlayer insulation film included in at least any two of the three regions of the pixel region, the peripheral circuit region and the scribe lane region to be nearly equivalent to each other, before the CMP is performed on the entirety of the surface thereof.

With such a structure, the occurrence of the global level difference can be easily suppressed.

A solid-state imaging device according to the present invention comprising, on a main surface of a semiconductor substrate, a pixel region, a peripheral circuit region located around a periphery of the pixel region, and a scribe lane region located around the periphery of the peripheral circuit region, the solid-state imaging device comprises: pixels formed in the pixel region; a driving circuit for driving the pixels in the peripheral circuit region; a photodiode protection insulation film, for protecting a photodiode acting as a component of each of the pixels, which is formed on the main surface of the semiconductor substrate; a dummy protection insulation film, corresponding to the photodiode protection insulation film, which is formed both in the peripheral circuit region and the scribe lane region; and an interlayer insulation film covering three regions of the pixel region in which the pixels and the photodiode protection insulation film are formed, the peripheral circuit region in which the driving circuit and the dummy protection insulation film are formed, and the scribe lane region, for separating an integrated circuit region including the pixel region and the peripheral circuit region from an adjacent integrated circuit region, in which the dummy protection insulation film is formed, wherein the dummy protection insulation film causes an average height of a surface of the interlayer insulation film included in each of the peripheral circuit region and the scribe lane region to be close to an average height of a surface of the interlayer insulation film included in the pixel region, before a CMP is performed on an entirety of the surface thereof.

According to the present invention, it is preferable that the dummy protection insulation film causes the average heights of the surfaces of the interlayer insulation film included in at least any two of the three regions of the pixel region, the peripheral circuit region and the scribe lane region to be nearly equivalent to each other, before the CMP is performed on the entirety of the surface thereof.

According to the present invention, it is also preferable that the solid-state imaging device further comprises on the main surface of the semiconductor substrate a dummy gate electrode, not functioning as a transistor, which is formed in either at least one of the peripheral circuit region and the scribe lane region, wherein the interlayer insulation film further covers the dummy gate electrode, and the dummy gate electrode causes the average height of the surface of the interlayer insulation film included in each of the peripheral circuit region and the scribe lane region to be close to the average height of the surface of the interlayer insulation film included in the pixel region, before the CMP is performed on the entirety of the surface thereof.

According to the present invention, it is also preferable that the dummy protection insulation film and the dummy gate electrode cause the average heights of the surfaces of the interlayer insulation film included in at least any two of the three regions of the pixel region, the peripheral circuit region and the scribe lane region to be nearly equivalent to each other, before the CMP is performed on the entirety of the surface thereof.

According to the solid-state imaging device of the present invention and the method for fabricating the same, the average heights of the surfaces of the interlayer insulation film included in the regions, each having the different wiring density, can be nearly equivalent to each other, before the CMP is performed on the entirety of the surface thereof, thereby making it possible to cause the polishing rate of the surface of the interlayer insulation film to be nearly equivalent accordingly among the regions, each having the different wiring density. When the polishing rate of the interlayer insulation film is nearly equivalent among the regions, the global level difference between the regions, each having the different wiring density and also the global level difference in the pixel region can be reduced after the CMP is performed on the entirety of the surface of the interlayer insulation film. Thus, it becomes possible to realize the microfabrication of the wiring portion of a cell and the miniaturization of the cell as well as the image sensor having a higher resolution.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
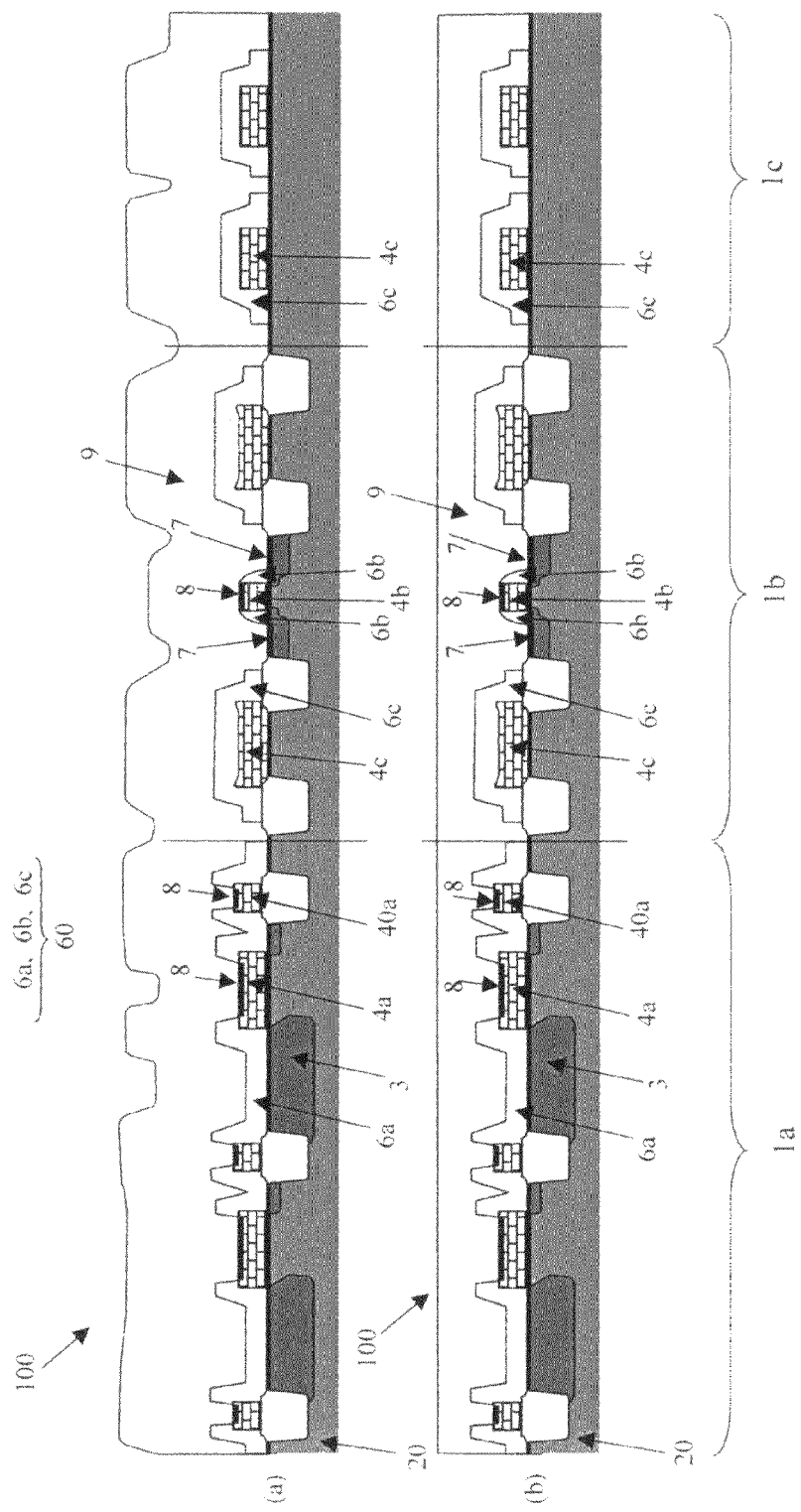
FIG. 1 is a cross-sectional view illustrating a solid-state imaging device according to a first embodiment of the present invention.

Hereinafter, a first embodiment of the present invention will be described with reference to the drawings. FIG. 1(b) is a cross-sectional view illustrating a MOS type solid-state imaging device according to the first embodiment. FIG. 1(a) is a cross-sectional view illustrating a state before a CMP is performed on a surface of an interlayer insulation film of the solid-state imaging device shown in FIG. 1(b).

On a main surface of a semiconductor substrate 20, a solid-state imaging device 100 according to the first embodiment comprises a pixel region 1a in which pixels are formed, a peripheral circuit region 1b, formed around the periphery of the pixel region, in which driving circuit for driving the pixels included in the pixel region 1a is formed, and a scribe lane region 1c, formed around the periphery of the peripheral circuit region 1b, for separating an integrated circuit region including the pixel region 1a and the peripheral circuit region 1b from an adjacent integrated circuit region (not shown). Also, the solid-state imaging device 100 comprises a pixel transistor as a component of each of the pixels. The pixel transistor has a photodiode (a source region) 3, a drain region, and a gate electrode 4a and its wiring 40a. The driving circuit includes a driving circuit transistor. The driving circuit transistor has a gate electrode 4b and its wiring (not shown) and a source/drain region. Furthermore, the solid-state imaging device 100 comprises insulation films 6a, 6b and 6c (generically denoted by 60) and an interlayer insulation film 9.

In the pixel region 1a, the photodiode 3 is formed in the interior of the main surface of the semiconductor substrate 20, and constitutes a pixel as the source region of the pixel transistor.

In the pixel region 1a, the gate electrode 4a and its wiring 40a of the pixel transistor are formed on the main surface of the semiconductor substrate 20, and constitute the pixel. The gate electrode 4a of the pixel transistor is a read gate electrode for reading an electrical charge from the photodiode 3, for example. The gate electrode 4a shown in the drawings is the read gate electrode.

In the peripheral circuit region 1b, the gate electrode 4b and its wiring (not shown) of the driving circuit transistor are formed on the main surface of the semiconductor substrate 20, and constitute the driving circuit for driving the pixel.

In at least either of the peripheral circuit region 1b and the scribe lane region 1c, a dummy gate electrode 4c is provided on the main surface of the semiconductor substrate 20. The dummy gate electrode 4c is a dummy electrode which does not function as a transistor.

The insulation film 60 is selectively formed on the main surface of the semiconductor substrate 20. The insulation film 60 is a TEOS (Tetra Ethyl Ortho Silicate) film, for example. In a method for fabricating the solid-state imaging device, as will be described hereafter, the insulation film 60 is the TEOS film. The insulation film 60 includes the insulation film 6a corresponding to a portion covering the gate electrode 4a and its wiring 40a of the pixel transistor and to a portion covering the photodiode 3, the insulation film 6b corresponding to a portion, as a side wall spacer, formed on a side wall of the gate electrode 4b of the driving circuit transistor, and the insulation film 6c corresponding to a portion selectively formed at a position where neither the gate electrode 4a and its wiring 40a nor the gate electrode 4b and its wiring (not shown) are formed in each of the peripheral circuit region 1b and the scribe lane region 1c. Forming steps of the insulation films 6a and 6c and the insulation film 6b (the side wall spacer) will be described later in the section describing the method for fabricating the solid-state imaging device. Note that the claimed term "a dummy protection insulation film" is defined as the insulation film 6c corresponding to the portion selectively formed at the position where neither the gate electrode 4a and its wiring 40a nor the gate electrode and its wiring (not shown) are formed in each of the peripheral circuit region 1b and the scribe lane region 1c.

The interlayer insulation film 9 is formed over the entirety of the main surface of the semiconductor substrate 20 so as to cover the insulation film 60 therewith. The interlayer insulation film 9 is a BPSG (Boron Phosphorous Silicate Glass) film, for example. In the method for fabricating the solid-state imaging device, as will be described hereafter, the interlayer insulation film is the BPSG film.

The insulation film 6c and the dummy gate electrode 4c cause an average height of a surface of the interlayer insulation film 9 included in each of the peripheral circuit region 1b and the scribe lane region 1c to be close to an average height of a surface of the interlayer insulation film 9 included in the pixel region 1a, before the CMP is performed on the entirety of the surface thereof.

In the solid-state imaging device 100 according to the first embodiment, when the CMP is performed on the surface of the interlayer insulation film 9, the global level difference between the pixel region 1a, the peripheral circuit region 1b and the scribe lane region 1c can be reduced. When the CMP is performed in a state shown in FIG. 1(a), the global level difference on the surface of the interlayer insulation film 9 can be reduced, as shown in FIG. 1(b).

The reason for reducing the global level difference will be described below. The insulation film 6c patterned with the dummy gate electrode 4c is formed in each of the peripheral circuit region 1b and the scribe lane region 1c, thereby making it possible to cause the average heights of the surfaces, each being calculated per unit area, of the interlayer insulation film 9 included in the regions 1a, 1b and 1c, each having a different wiring density, to be nearly equivalent to each other, before the CMP is performed on the entirety of the surface thereof. Thus, a polishing rate of the interlayer insulation film 9 can be nearly equivalent among the regions 1a, 1b and 1c, each having the different wiring density. When the polishing rate of the interlayer insulation film 9 is nearly equivalent among the regions 1a, 1b and 1c, the global level difference between the regions 1a, 1b and 1c, each having the different wiring density, can be reduced accordingly after the CMP is performed on the surface of the interlayer insulation film 9. Furthermore, the polishing rate can be also nearly equivalent in each of the regions. Thus, the global level difference in the pixel region 1a can be reduced. That is to say, it becomes possible to improve the flatness across the surface of the interlayer insulation film 9 included in the pixel region 1a.

In the first embodiment, it is preferable that the dummy gate electrode 4c and the insulation film 60 are formed such that the average heights of the surfaces of the interlayer insulation film 9 included in the pixel region 1a, the peripheral circuit region 1b and the scribe lane region 1c are to be substantially equivalent to each other, before the entirety of the surface of the interlayer insulation film 9 is polished. The dummy gate electrode 4c and the insulation film 60 are formed in the above-described manner, thereby making it possible to assuredly suppress an occurrence of the global level difference.

Furthermore, in the first embodiment, it is also preferable that a pattern density occupied by all of the dummy gate electrode 4c, the gate electrodes 4a and its wiring, and the gate electrode 4b and its wiring (not shown) is substantially equivalent among the pixel region 1a, the peripheral circuit region 1b and the scribe lane region 1c. Still furthermore, it is also preferable that a pattern density occupied by all of the insulation film 6a formed on the photodiode 3, the insulation film 6b (the side wall spacer) and the insulation film 6c formed in a selective manner are substantially equivalent among the pixel region 1a, the peripheral circuit region 1b and the scribe lane region 1c.

Furthermore, in the first embodiment, the dummy gate electrode 4c preferably has the same shape and size as the gate electrode 4a of the pixel transistor. The shape and size of the dummy gate electrode 4c are set in the above-described manner, thereby making it possible to assuredly suppress the occurrence of the global level difference.

Figure 2:
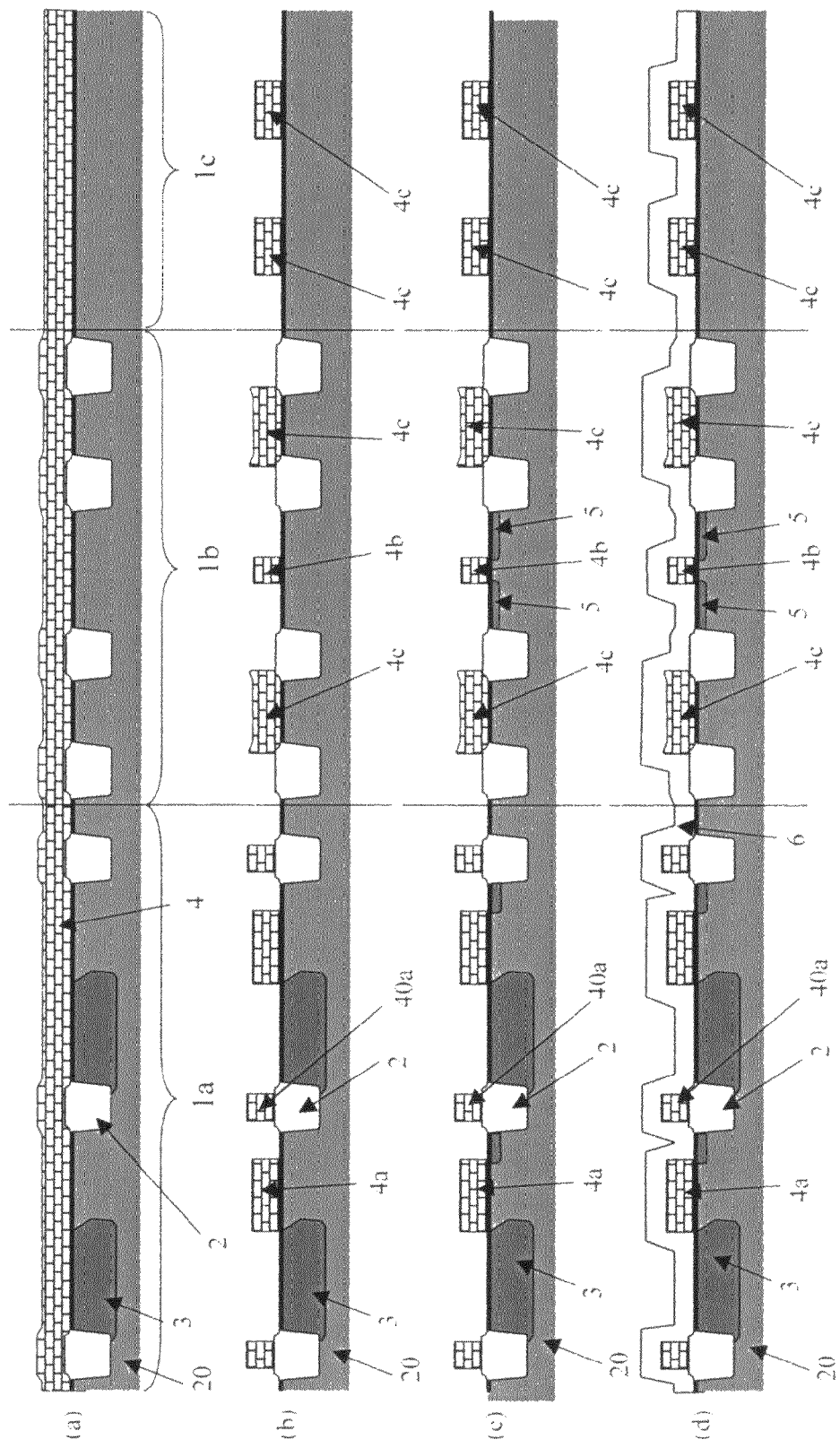
FIG. 2 is a cross-sectional view illustrating steps of a method for fabricating the solid-state imaging device according to the first embodiment of the present invention.
Figure 3:
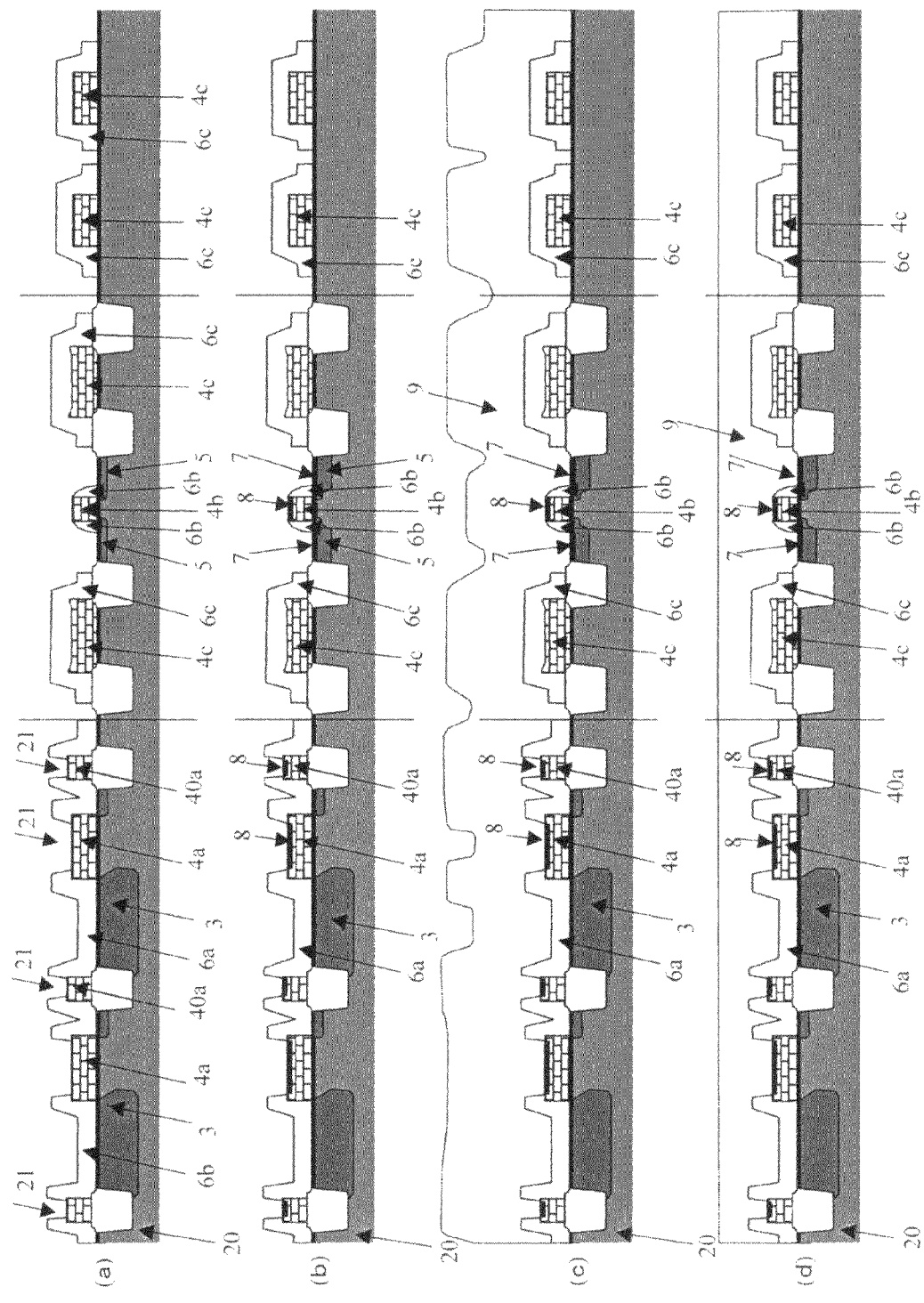
FIG. 3 is a cross-sectional view illustrating steps subsequent to the steps shown in FIG. 2 of the method for fabricating the solid-state imaging device according to the first embodiment of the present invention.

Next, the method for fabricating the solid-state imaging device according to the first embodiment will be described with reference to the drawings. FIGS. 2 and 3 are cross-sectional views illustrating steps of the method for fabricating the MOS type solid-state imaging device. The step shown in FIG. 3(a) is a step subsequent to the step shown in FIG. 2(d).

Firstly, a device isolation insulating region 2 as a STI and the photodiode 3 as a low concentration impurity diffusion region having a conductivity type opposite to that of the semiconductor substrate 20, are formed in the interior of the semiconductor substrate 20 (FIG. 2(a)). Thereafter, a silicon film 4 is formed on the semiconductor substrate 20 (FIG. 2(a)). Then, the silicon film 4 is selectively etched to be removed, thereby forming the gate electrode 4a (e.g., the read gate electrode 4a for reading the electrical charge) and its wiring 40a of each MOS transistor constituting the pixel in the pixel region 1a, and forming the gate electrode 4b and its wiring (not shown) of a general logic circuit MOS transistor in the peripheral circuit region 1b (FIG. 2(b)). The logic circuit MOS transistor is operable to drive the pixel included in the pixel region 1a. Furthermore, the silicon film 4 is selectively etched to be removed, thereby also forming the dummy gate electrode 4c in the peripheral circuit region 1b and the scribe lane region 1c as well as the gate electrodes 4a and 4b (FIG. 2(b)).

Specifically, in the peripheral circuit region 1b, the dummy gate electrode 4c is formed in an area where the gate electrode 4b and its wiring of each MOS transistor belonging to the logic circuit are not densely located. Since the dummy gate electrode 4c is formed in the area where the gate electrode 4b and its wiring are not densely located, a pattern density occupied by all of the gate electrode 4b and its wiring and the dummy gate electrode 4c can be nearly uniform in the peripheral circuit region 1b. In the scribe lane region 1c, a pattern density occupied by the dummy gate electrode 4c is nearly uniform. A pattern density occupied by the gate electrode 4a and its wiring 40a included in the pixel region 1a, the pattern density occupied by the gate electrode 4b and its wiring and the dummy gate electrode 4c included in the peripheral circuit region 1b, and the pattern density occupied by the dummy gate electrode 4c included in the scribe lane region 1c are set so as to be equivalent or nearly equivalent to each other.

Next, ions are implanted into the main surface of the semiconductor substrate 20 using the gate electrodes 4a and 4b as a mask. By this ion implantation, a low concentration impurity diffusion layer 5 acting as a LDD (Lightly Doped Drain) of the MOS transistor is formed (FIG. 2(c)). Thereafter, the TEOS film 6 is formed over the entirety of the main surface of the semiconductor substrate 20 (FIG. 2(d)). Then, a resist film pattern which is not shown is formed on the TEOS film 6, and an anisotropic dry etching is performed. The anisotropic dry etching is usually performed by using plasma. By performing this etching, in the pixel region 1a, the TEOS film 6 is selectively removed to form an opening 21 exposing a portion of an upper face of each of the gate electrode 4a and its wiring 40a such that the TEOS film 6 which is not removed to form the opening 21 is caused to remain as it is. As a result, in the pixel region 1a, the TEOS film 6a remains on the photodiode 3.

Furthermore, by performing this etching, in each of the peripheral circuit region 1b and the scribe lane region 1c, the TEOS film 6c formed around the periphery of the dummy gate electrode 4c is removed such that the TEOS film 6c is caused to remain so as to cover the dummy gate electrode 4c therewith (FIG. 3(a)). As a result, the TEOS film 6c remains so as to cover an upper face and side faces of the dummy gate electrode 4c. Still furthermore, by performing this etching using plasma, in the peripheral circuit region 1b, the side wall spacer 6b made of the TEOS film 6 is formed on the side wall of the gate electrode 4b (FIG. 3(a)). The TEOS film 6 formed around the periphery of the side wall spacer 6b is removed.

The side wall spacer 6b provided on the side wall of the gate electrode 4b constitutes a MOS transistor having the LDD structure. Preferably, the TEOS film 6c formed so as to cover the dummy gate electrode 4c is only formed on the dummy gate electrode 4c and around the periphery thereof (FIG. 3(a)) such that a semiconductor substrate region which is to be a source/drain region of the MOS transistor having the LDD structure is not to be covered therewith (FIG. 3(a)). If the TEOS film 6c covers the semiconductor substrate region which is to be the source/drain region of the MOS transistor having the LDD structure, the TEOS film 6c prevents ions from being implanted into the semiconductor substrate region, thereby making it impossible to form the source/drain region. Note that in the pixel region 1a, the TEOS film 6a is provided at least on the photodiode 3. This is because the TEOS film 6a acts as a protection layer for preventing the photodiode 3 from being damaged by the plasma used when forming the side wall spacer 6b. A drain region of a transfer transistor for transferring a signal electrical charge generated by the photodiode 3, and a source/drain region of an amplifier transistor or other transistors may be covered with the TEOS film 6, as shown in FIG. 3, or may not be covered with the TEOS film 6. As not shown in FIG. 3, the side wall spacer may be formed on a side wall of the gate electrode 4a of each of the transfer transistor, the amplifier transistor and the other transistors.

Thereafter, a high concentration impurity is introduced by ion implantation using the gate electrode 4b of the MOS transistor and the side wall spacer 6b as a mask. By this ion plantation, the source/drain region having the LDD structure is formed. Next, a metal silicide layer 7 and a metal silicide layer 8 are formed on the surface of the semiconductor substrate 20 not being covered with the remaining TEOS films 6a, 6b and 6c and formed on the upper faces of the gate electrodes 4a and 4b, respectively (FIG. 3(b)). The metal silicide layers 7 and 8 are made of titanium silicide, cobalt silicide or the like. The metal silicide layer 7 and the metal silicide layer 8 are formed by thermally reacting materials forming the surface of the semiconductor substrate 20 and the upper faces of the gate electrodes 4a and 4b, respectively, with a metal such as titanium, cobalt or the like (FIG. 3(b)). Then, a thick BPSG film 9 is formed over the entirety of the main surface of the semiconductor substrate 20 (FIG. 3(c)), thereby covering the TEOS films 6a, 6b and 6c with the BPSG film 9. Next, the CMP is performed on the entirety of a surface of the BPSG film 9, thereby planarizing the entirety of the surface of the BPSG film 9 covering all of the pixel region 1a, the peripheral circuit region 1b and the scribe lane region 1c (FIG. 3(d)).

Through the steps of fabrication described above, the entirety of the surface of the BPSG film 9 of the solid-state imaging device 100 is planarized. In the first embodiment, the dummy gate electrode 4c is formed in each of the peripheral circuit region 1b and the scribe lane region 1c. Also, the insulation film (the TEOS film) 6 is caused to selectively remain at least at a position where neither the gate electrode 4a and its wiring 40a nor the gate electrode 4b and its wiring (not shown), all of which constitute MOS transistors in the peripheral circuit region 1b and the scribe lane region 1c, are formed. Thus, the average heights of the surfaces of the TEOS film 6 included in the pixel region 1a, the peripheral circuit region 1b and the scribe lane region 1c can be nearly equivalent to each other. A surface shape of the BPSG film 9 reflects unevenness of the TEOS film 6. Therefore, the average heights of the surfaces of the BPSG film 9 included in the pixel region 1a, the peripheral circuit region 1b and the scribe lane region 1c can be nearly equivalent to each other. When the CMP is performed on the entirety of the surface of the BPSG film 9 in a state where the average heights of the surfaces of the BPSG film 9 included in all the regions are nearly equivalent to each other, the entirety of the surface of the BPSG film 9 can be polished at a nearly uniform speed. Therefore, the entirety of the surface of the BPSG film 9 can be nearly flattened throughout all the regions after the CMP is performed on the surface thereof. Thus, it becomes possible to reduce the global level difference which has been the problem of the prior art.

Second Embodiment

Figure 4:
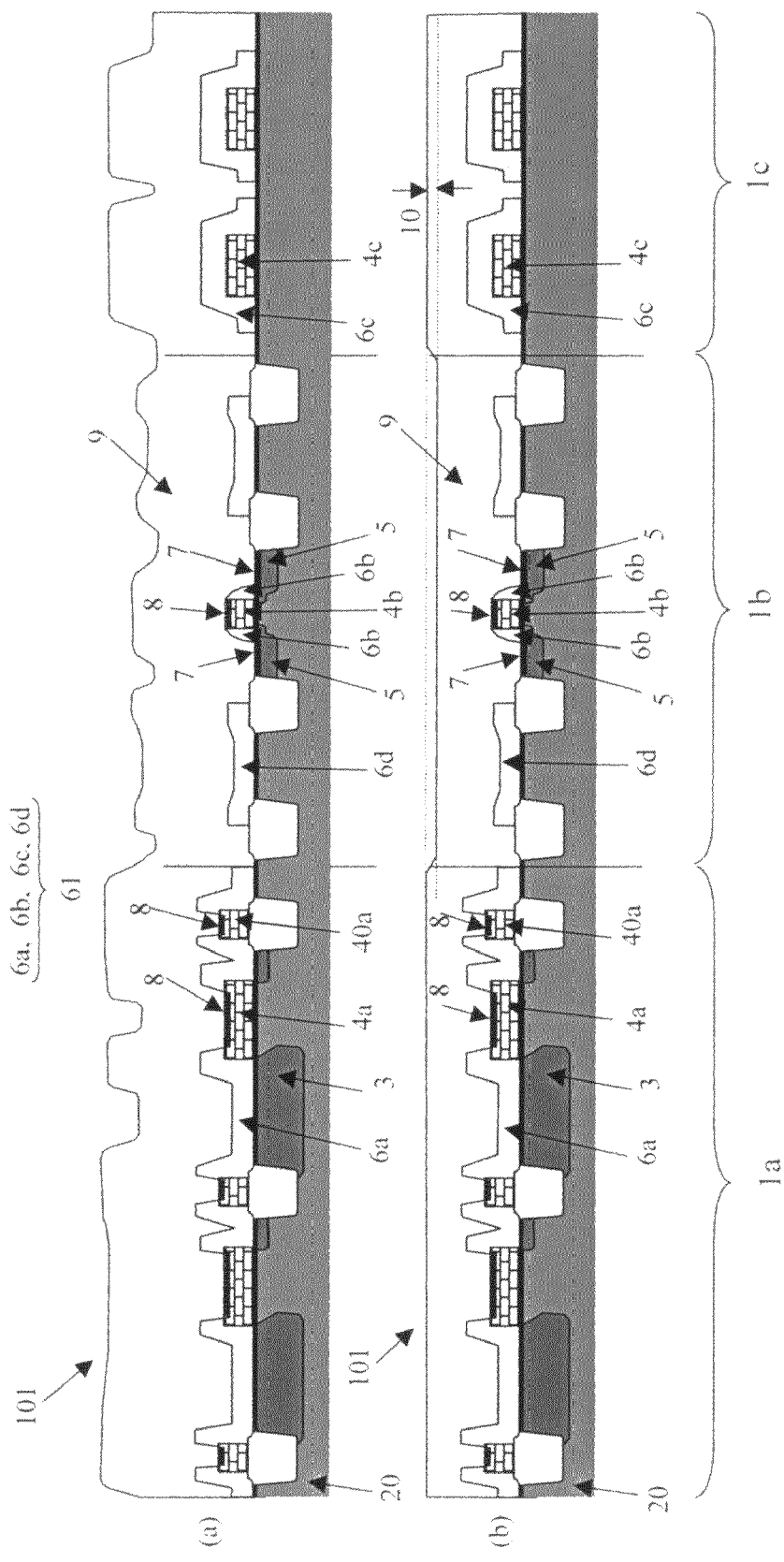
FIG. 4 is a cross-sectional view illustrating the solid-state imaging device according to a second embodiment of the present invention.

Hereinafter, a second embodiment of the present invention will be described with reference to the drawings. FIG. 4(b) is a cross-sectional view illustrating the MOS type solid-state imaging device according to the second embodiment. FIG. 4(a) is a cross-sectional view illustrating a state before the CMP is performed on the surface of the interlayer insulation film of the solid-state imaging device shown in FIG. 4(b). In the second embodiment, the same components as those of the first embodiment will be denoted by the same reference numerals.

On the main surface of the semiconductor substrate 20, a solid-state imaging device 101 according to the second embodiment comprises the pixel region 1a in which the pixels are formed, the peripheral circuit region 1b, formed around the periphery of the pixel region, in which the driving circuit for driving the pixels included in the pixel region 1a is formed, and the scribe lane region 1c, formed around the periphery of the peripheral circuit region 1b, for separating the integrated circuit region including the pixel region 1a and the peripheral circuit region 1b from the adjacent integrated circuit region (not shown). Also, the solid-state imaging device 101 comprises the pixel transistor as a component of each of the pixels. The pixel transistor has the photodiode (source region) 3, the drain region, and the gate electrode 4a and its wiring 40a. The driving circuit includes the driving circuit transistor. The driving circuit transistor has the gate electrode 4b and its wiring (not shown) and the source/drain region. Furthermore, the solid-state imaging device 101 comprises insulation films 6a, 6b, 6c and 6d (generically denoted by 61) and the interlayer insulation film 9.

In the pixel region 1a, the photodiode 3 is formed in the interior of the main surface of the semiconductor substrate 20, and constitutes a pixel as the source region of the pixel transistor.

In the pixel region 1a, the gate electrode 4a and its wiring 40a of the pixel transistor are formed on the main surface of the semiconductor substrate 20, and constitute the pixel. The gate electrode 4a of the pixel transistor is a read gate electrode for reading an electrical charge from the photodiode 3, for example. The gate electrode 4a shown in the drawings is the read gate electrode.

In the peripheral circuit region 1b, the gate electrode 4b and its wiring (not shown) of the driving circuit transistor are formed on the main surface of the semiconductor substrate 20, and constitute the driving circuit for driving the pixel.

In the scribe lane region 1c, the dummy gate electrode 4c is provided on the main surface of the semiconductor substrate 20. The dummy gate electrode 4c is a dummy electrode which does not function as a transistor.

The insulation film 61 is selectively formed on the main surface of the semiconductor substrate 20. The insulation film 61 includes the insulation film 6a corresponding to the portion covering the gate electrode 4a and its wiring 40a of the pixel transistor and to the portion covering the photodiode 3, the insulation film 6b corresponding to the portion, as the side wall spacer, formed on the side wall of the gate electrode 4b of the driving circuit transistor, the insulation film 6c corresponding to a portion selectively formed in the scribe lane region 1c, and the insulation film 6d corresponding to a portion selectively formed in the peripheral circuit region 1b. Forming steps of the insulation films 6a, 6c and 6d and the insulation film 6b (the side wall spacer) will be described later in the section describing the method for fabricating the solid-state imaging device.

The interlayer insulation film 9 is formed over the entirety of the main surface of the semiconductor substrate 20 so as to cover the insulation film 61 therewith.

The insulation films 6c and 6d and the dummy gate electrode 4c cause the average height of the surface of the interlayer insulation film 9 included in each of the peripheral circuit region 1b and the scribe lane region 1c to be close to the average height of the surface of the interlayer insulation film 9 included in the pixel region 1a, before the CMP is performed on the entirety of the surface thereof.

In the solid-state imaging device 101 according to the second embodiment, when the CMP is performed in a state shown in FIG. 4(a), the global level difference on the surface of the interlayer insulation film 9 can be reduced, as shown in FIG. 4(b) For schematically showing the global level difference, in FIG. 4(b), each of the three regions is flat and a level difference exits at the boundary portions between the regions. In practice, however, the surface of the interlayer insulation film 9 included in each of the pixel region 1a, the peripheral circuit region 1b and the scribe lane region 1c is slanted. A height of the surface of the interlayer insulation film 9 becomes gradually lower from the center portion of the pixel region 1a to a center portion of a width of the peripheral circuit portion 1b having a strip shape, and the height of the surface thereof becomes gradually greater from the center portion of the width thereof to the peripheral portion of the scribe lane region 1c. However, with the patterned insulation film 6d provided in the peripheral circuit region 1b, the height of the surface of the interlayer insulation film 9 included in the peripheral circuit region 1b can be greater. Thus, the polishing rates of the surfaces of the interlayer insulation film 9 can be close to each other between the peripheral circuit region 1b and the pixel region 1a, thereby suppressing an influence exerted on the polishing rate in the pixel region 1a by the polishing rate in the peripheral circuit region 1b. As a result, it becomes possible to reduce the global level difference in the pixel region 1a to a minimum. Furthermore, the insulation film 6c patterned with the dummy gate electrode 4c is formed in the scribe lane region 1c. Thus, before the CMP is performed on the entirety of the surface of the interlayer insulation film 9, the average height of the surface of the interlayer insulation film 9 included in the scribe lane region 1c can be greater than the average height of the interlayer insulation film 9 included in the peripheral circuit region 1b. When the CMP is performed in such a state described above, a polishing pad used during the CMP is supported by the pixel region 1a and the scribe lane region 1c, and thus the pixel region 1a and the scribe lane region 1c are polished prior to the peripheral circuit region 1b. Therefore, it becomes possible to reduce the global level difference between the regions to a minimum and to suppress the occurrence of the global level difference in the pixel region 1a, after the CMP is performed on the entirety of the surface of the interlayer insulation film 9.

In the second embodiment, it is preferable that the dummy gate electrode 4c and the insulation film 61 are formed in the pixel region 1a and the scribe lane region 1c such that the average heights of the surfaces of the interlayer insulation film 9 included in the above two regions are to be substantially equivalent to each other, before the entirety of the surface of the interlayer insulation film 9 is polished. The dummy gate electrode 4c and the insulation film 61 are formed in the above-described manner, thereby making it possible to assuredly reduce the occurrence of the global level difference as compared to the prior art.

Furthermore, in the second embodiment, it is preferable that a pattern density occupied by the gate electrode 4a and its wiring 40a included in the pixel region 1a and a pattern density occupied by the dummy gate electrode 4c included in the scribe lane region 1c are substantially equivalent to each other. Furthermore, it is also preferable that a pattern density occupied by the insulation film 6a, on the photodiode 3, included in the pixel region 1a and a pattern density occupied by the patterned insulation film 6c included in the scribe lane region 1c are substantially equivalent to each other.

Still furthermore, in the second embodiment, the dummy, gate electrode 4c preferably has the same shape and size as the gate electrode 4a of the pixel transistor. The shape and size of the dummy gate electrode 4c are set in the above-described manner, thereby making it possible to assuredly suppress the occurrence of the global level difference.

Figure 5:
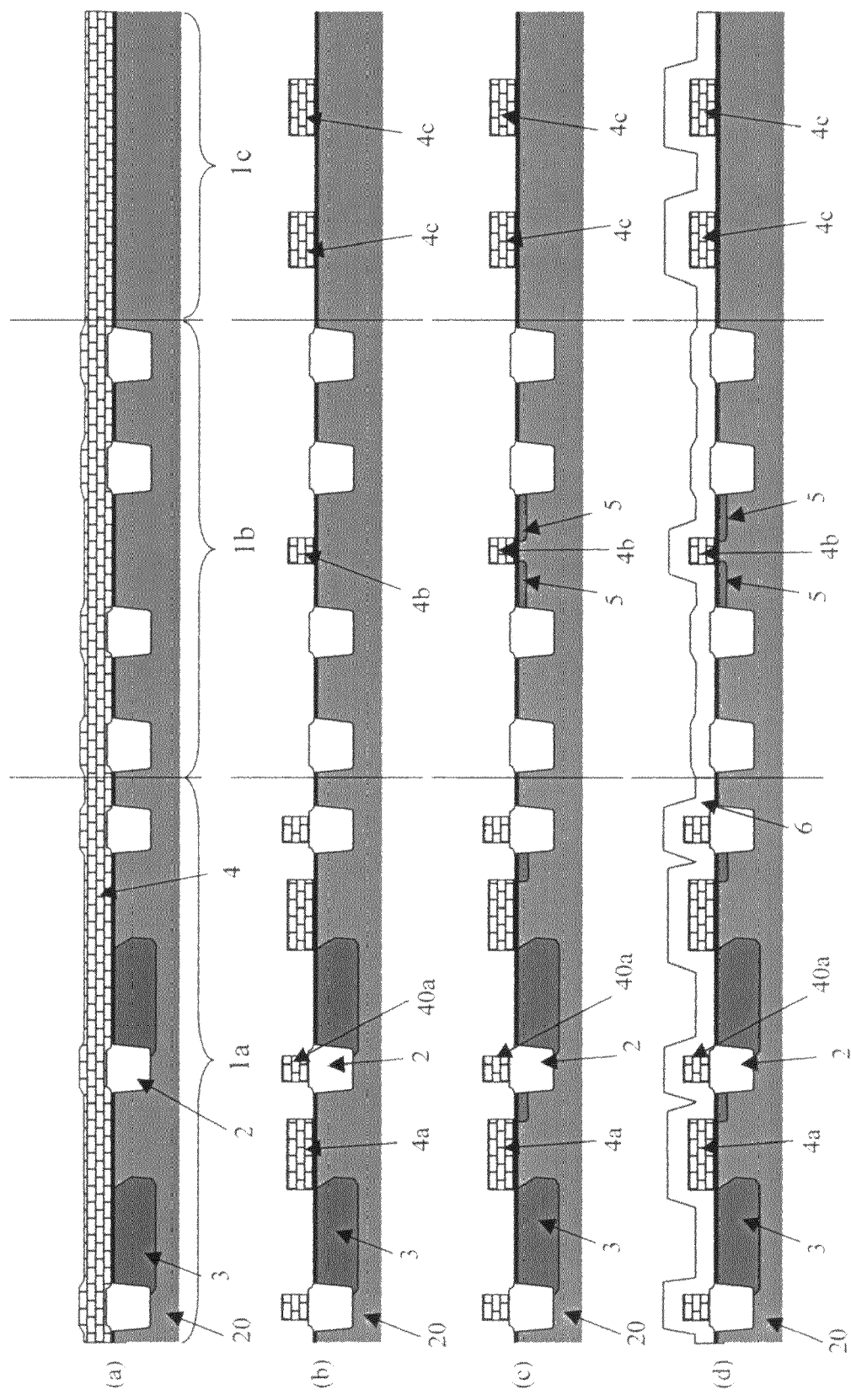
FIG. 5 is a cross-sectional view illustrating steps of a method for fabricating the solid-state imaging device according to the second embodiment of the present invention.
Figure 6:
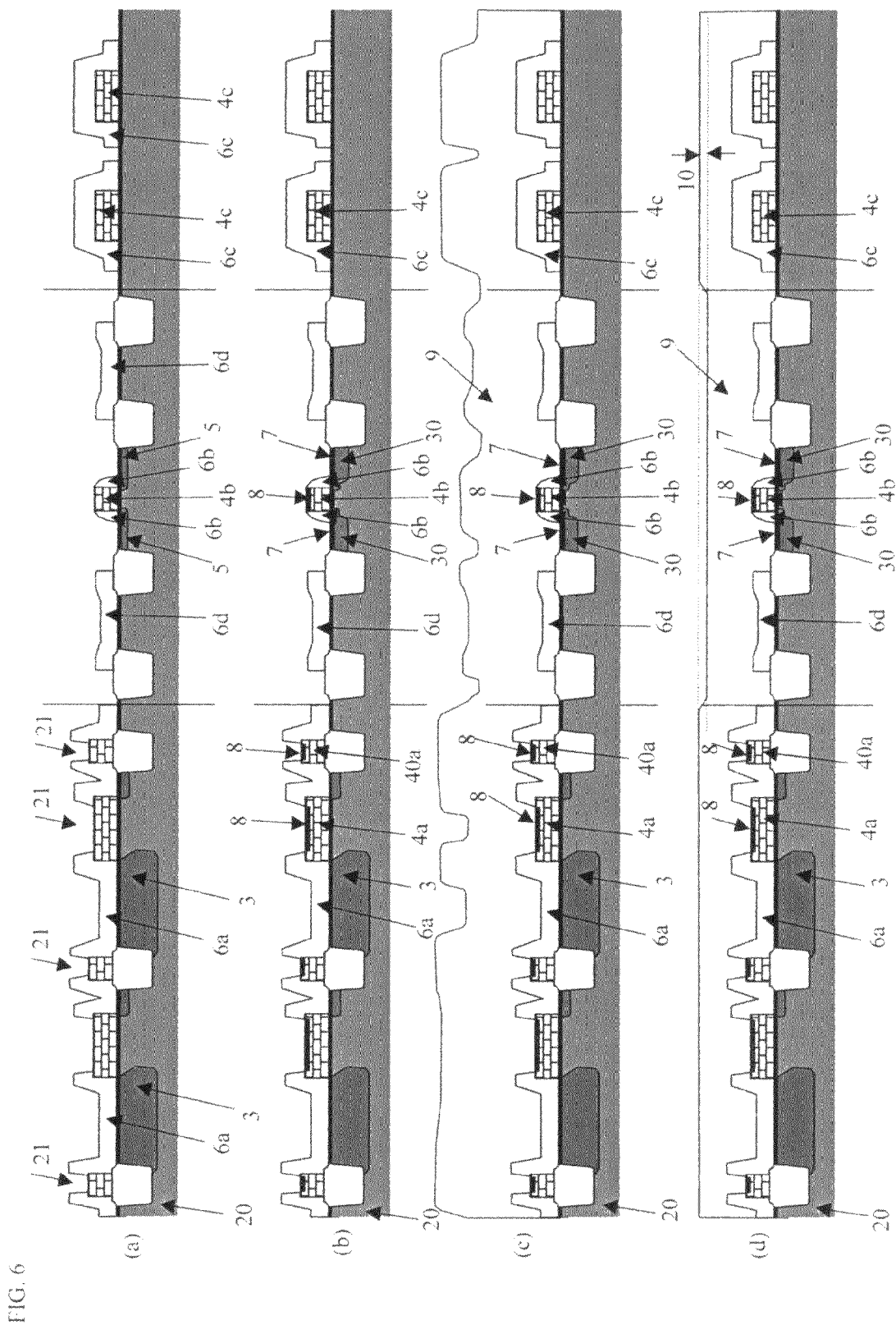
FIG. 6 is a cross-sectional view illustrating steps subsequent to the steps shown in FIG. 5 of the method for fabricating the solid-state imaging device according to the second embodiment of the present invention.

Hereinafter, the method for fabricating the solid-state imaging device according to the second embodiment will be described with reference to the drawings. FIGS. 5 and 6 are cross-sectional views illustrating steps of the method for fabricating the MOS type solid-state imaging device according to the second embodiment of the present invention. The step shown in FIG. 6(a) is a step subsequent to the step shown in FIG. 5(d). In the second embodiment, the same components as those of the first embodiment will be denoted by the same reference numerals.

The second embodiment is only different from the first embodiment in that no dummy gate electrode 4c is provided in the peripheral circuit region 1b, and the TEOS film 6d is provided therein instead of the dummy gate electrode. Other steps of fabrication in the second embodiment are the same as those in the first embodiment.

Firstly, the device isolation insulating region 2 as the STI and the photodiode 3 as the low concentration impurity diffusion region having a conductivity type opposite to that of the semiconductor substrate 20, are formed in the interior of the semiconductor substrate 20 (FIG. 5(a)). Thereafter, the silicon film 4 is formed on the semiconductor substrate 20 (FIG. 5(a)). Then, the silicon film 4 is selectively etched to be removed, thereby forming the gate electrode 4a (e.g., the read gate electrode 4a for reading the electrical charge) and its wiring 40a of each MOS transistor constituting the pixel in the pixel region 1a, and forming the gate electrode 4b and its wiring (not shown) of a general logic circuit MOS transistor in the peripheral circuit region 1b (FIG. 5(b)). The logic circuit MOS transistor is operable to drive the pixel included in the pixel region 1a. Furthermore, the silicon film 4 is selectively etched to be removed, thereby also forming the dummy gate electrode 4c in the scribe lane region 1c as well as the gate electrodes 4a and 4b (FIG. 5(b)). Unlike the first embodiment, no dummy gate electrode is formed in the peripheral circuit region 1b.

A pattern density occupied by the dummy gate electrode 4c is set so as to be nearly uniform in the scribe lane region 1c. Also, a pattern density occupied by the gate electrode 4a and its wiring 40a included in the pixel region 1a and the pattern density occupied by the dummy gate electrode 4c included in the scribe lane region 1c are set so as to be equivalent or nearly equivalent to each other.

Next, ions are implanted into the main surface of the semiconductor substrate 20 using the gate electrodes 4a and 4b as a mask so as to form the low concentration impurity diffusion layer 5 acting as the LDD (Lightly Doped Drain) of the MOS transistor (FIG. 5(c)). Thereafter, the TEOS film 6 is formed over the entirety of the main surface of the semiconductor substrate 20 (FIG. 5(d)). Then, a resist film pattern which is not shown is formed on the TEOS film 6, and the anisotropic dry etching is performed. The anisotropic dry etching is usually performed by using the plasma. By performing this etching, in the pixel region 1a, the TEOS film 6 is selectively removed to form the opening 21 exposing the portion of the upper face of each of the gate electrode 4a and its wiring 40a such that the TEOS film 6 which is not removed to form the opening 21 is caused to remain as it is. As a result, in the pixel region 1a, the TEOS film 6a remains on the photodiode 3. Still furthermore, by performing this etching, in the scribe lane region 1c, the TEOS film 6c formed around the periphery of the dummy gate electrode 4c is removed such that the TEOS film 6c is caused to remain so as to cover the dummy gate electrode 4c therewith (FIG. 6(a)). Furthermore, by performing this etching using the plasma, in the peripheral circuit region 1b, the side wall spacer 6b made of the TEOS film 6 is formed on the side wall of the gate electrode 4b (FIG. 6(a)). The TEOS film 6 formed around the periphery of the side wall spacer 6b is removed. Still furthermore, by performing this etching, the TEOS film 6d, having a substantially same size as the TEOS film 6a which is caused to remain on photodiode 3 included in the pixel region 1a, is caused to remain in the peripheral circuit region 1b, and the TEOS film 6 formed around the periphery of the remaining TEOS film 6d is removed. In the peripheral circuit region 1b, the TEOS 6d is formed in an area where the gate electrode 4b and its wiring of each MOS transistor belonging to the logic circuit are not densely located.

The side wall spacer 6b provided on the side wall of the gate electrode 4b constitutes a MOS transistor having the LDD structure. Preferably, the TEOS film 6d formed in the peripheral circuit region 1b is formed such that the semiconductor substrate region which is to be the source/drain region of the MOS transistor having the LDD structure is not to be covered therewith (FIG. 6(a)). If the TEOS film 6d covers the semiconductor substrate region which is to be the source/drain region of the MOS transistor having the LDD structure, the TEOS film 6d prevents ions from being implanted into the semiconductor substrate region, thereby making it impossible to form the source/drain region. Note that in the pixel region 1a, the TEOS film 6a is provided at least on the photodiode 3. This is because the TEOS film 6a acts as a protection layer for preventing the photodiode 3 from being damaged by the plasma used when forming the side wall spacer 6b. The drain region of the transfer transistor for transferring a signal electrical charge generated by the photodiode 3, and the source/drain region of the amplifier transistor or other transistors may be covered with the TEOS film 6, as shown in FIG. 6, or may not be covered with the TEOS film 6. As not shown in FIG. 6, the side wall spacer may be formed on the side wall of the gate electrode 4a of each of the transfer transistor, the amplifier transistor and the other transistors.

Thereafter, a high concentration impurity is introduced by ion implantation using the gate electrodes 4b and the side wall spacer 6b of the MOS transistor as a mask. By this ion plantation, a source/drain region 30 having the LDD structure is formed. Next, the metal silicide layer 7 and the metal silicide layer 8 are formed on the surface of the semiconductor substrate 20 not being covered with the remaining TEOS films 6b and 6d and on the upper faces of the gate electrodes 4a and 4b, respectively (FIG. 6(b)). The metal silicide layers 7 and 8 are made of titanium silicide, cobalt silicide or the like. The metal silicide layer 7 and the metal silicide layer 8 are formed by thermally reacting the materials forming the surface of the semiconductor substrate 20 and the upper faces of the gate electrodes 4a and 4b, respectively, with a metal such as titanium, cobalt or the like (FIG. 6(b)). Then, the thick BPSG film 9 is formed over the entirety of the main surface of the semiconductor substrate 20 (FIG. 6(c)), thereby covering the TEOS films 6a, 6b, 6c and 6d with the BPSG film 9. Next, the CMP is performed on the entirety of the surface of the BPSG film 9, thereby planarizing the entirety of the surface of the BPSG film 9 covering all of the pixel region 1a, the peripheral circuit region 1b and the scribe lane region 1c (FIG. 6(d)).

Through the steps of fabrication described above, the entirety of the BPSG film 9 of the solid-state imaging device 101 is planarized.

As described above, in the second embodiment, no dummy gate electrode is provided in the peripheral circuit region 1b. The reason therefor will be described below. If the dummy gate electrode is provided around the periphery of the MOS transistor, a parasitic capacitance is generated around the periphery of the dummy gate electrode, and thus a problem may occur in a high-speed operation of the peripheral circuit. More specifically, in spite of not electrically being connected to any device constituting the peripheral circuit, the dummy gate electrode has conductivity, and thus can be considered as a kind of wiring. Therefore, when the dummy gate electrode is disposed around the periphery of the gate electrode of the MOS transistor, the parasitic capacitance is generated in an area of the insulation film provided between the dummy gate electrode and the gate electrode. Furthermore, referring back to the peripheral circuit region 1b of FIG. 1, the dummy gate electrode 4c may be formed on the conductive semiconductor substrate 20 with a thin insulation film (not shown) interposed therebetween. In this case, the parasitic capacitance formed by the conductive semiconductor substrate 20 and the dummy gate electrode 4c both acting as electrodes is generated in an area of the thin insulation film.

Figure 10:
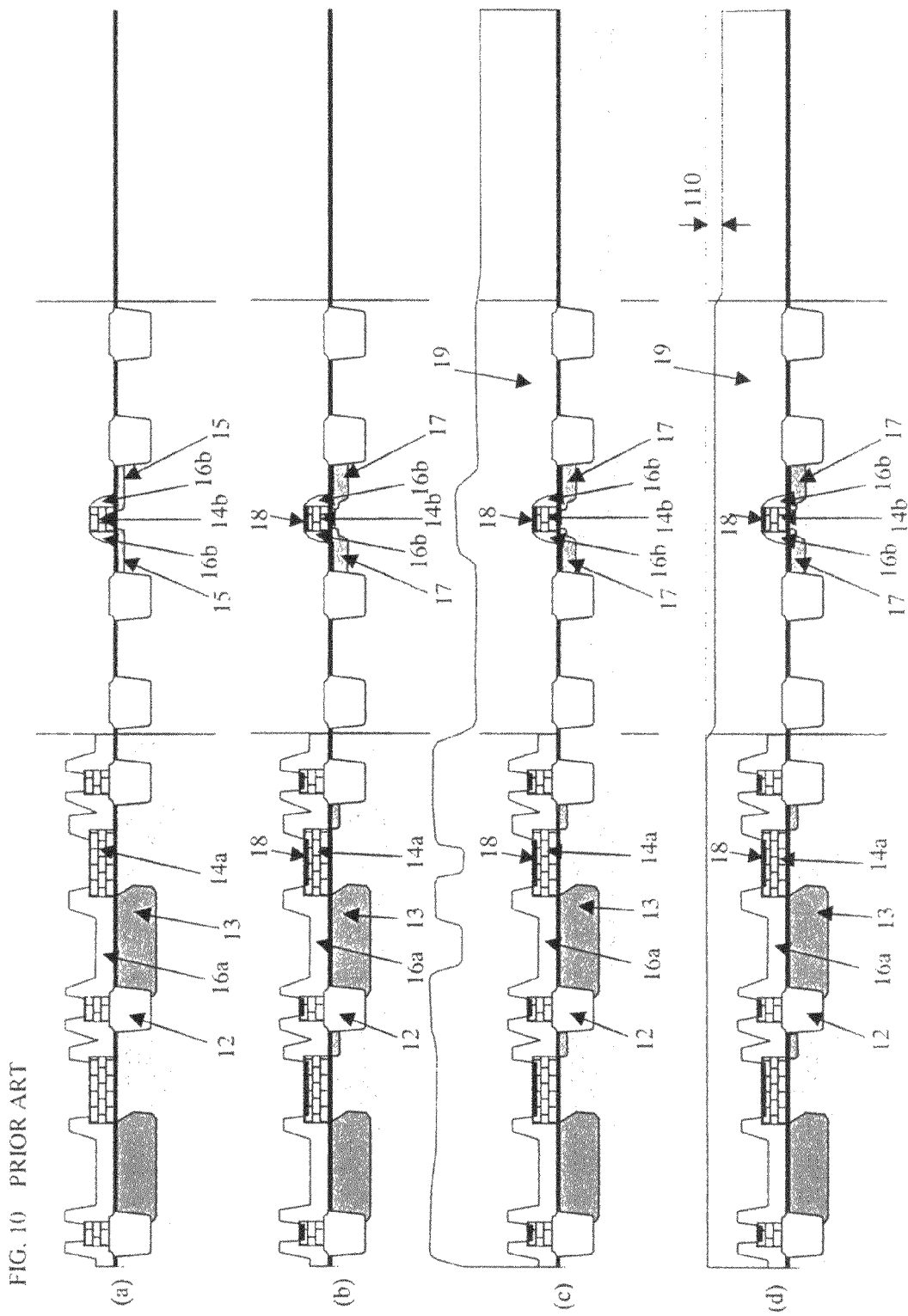
FIG. 10 is a cross-sectional view illustrating steps subsequent to the steps shown in FIG. 9 of the method for fabricating the conventional solid-state imaging device.
Figure 11:
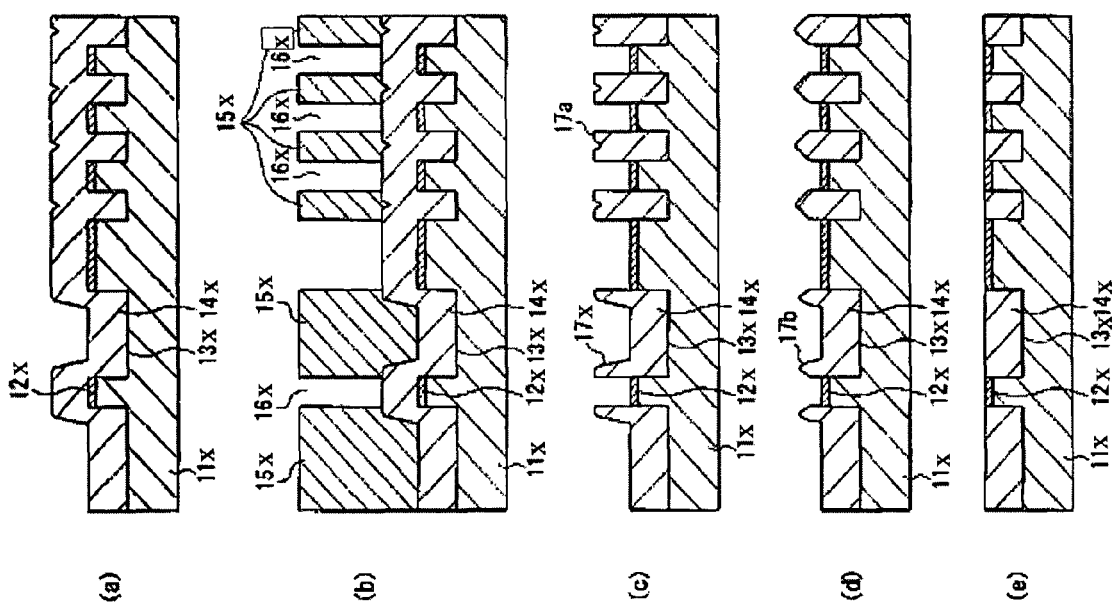
FIG. 11 is a cross-sectional view illustrating a method for fabricating a solid-state imaging device disclosed in Japanese Laid-Open Patent Publication No. 9-102539.

Also, in the second embodiment, the BPSG film 9 is laminated so as to fill in portions between the gate electrode 4a, the gate electrode 4b, and the dummy gate electrode 4c. In this case, as shown in FIG. 6(c), the average heights of the surfaces of the BPSG film 9 included in the pixel region 1a and the scribe lane region 1c are nearly equivalent to each other, and the average height of the surface of the BPSG film 9 included in the peripheral circuit region 1b is lower than those of the surfaces of the BPSG film included in other two regions. When the CMP is performed in such a state, as shown in FIG. 6(d), a height of a flat surface in the peripheral circuit region 1b is slightly lower than that of a flat surface in each of the other two regions, and thus the entirety of the chip is not as flat as that in the first embodiment. However, as described above with reference to FIG. 4, the global level difference in the pixel region 1a can be reduced, thereby making it possible to obtain the improved flatness across the pixel region 1a as compared to the prior art (FIG. 10).

Figure 7:
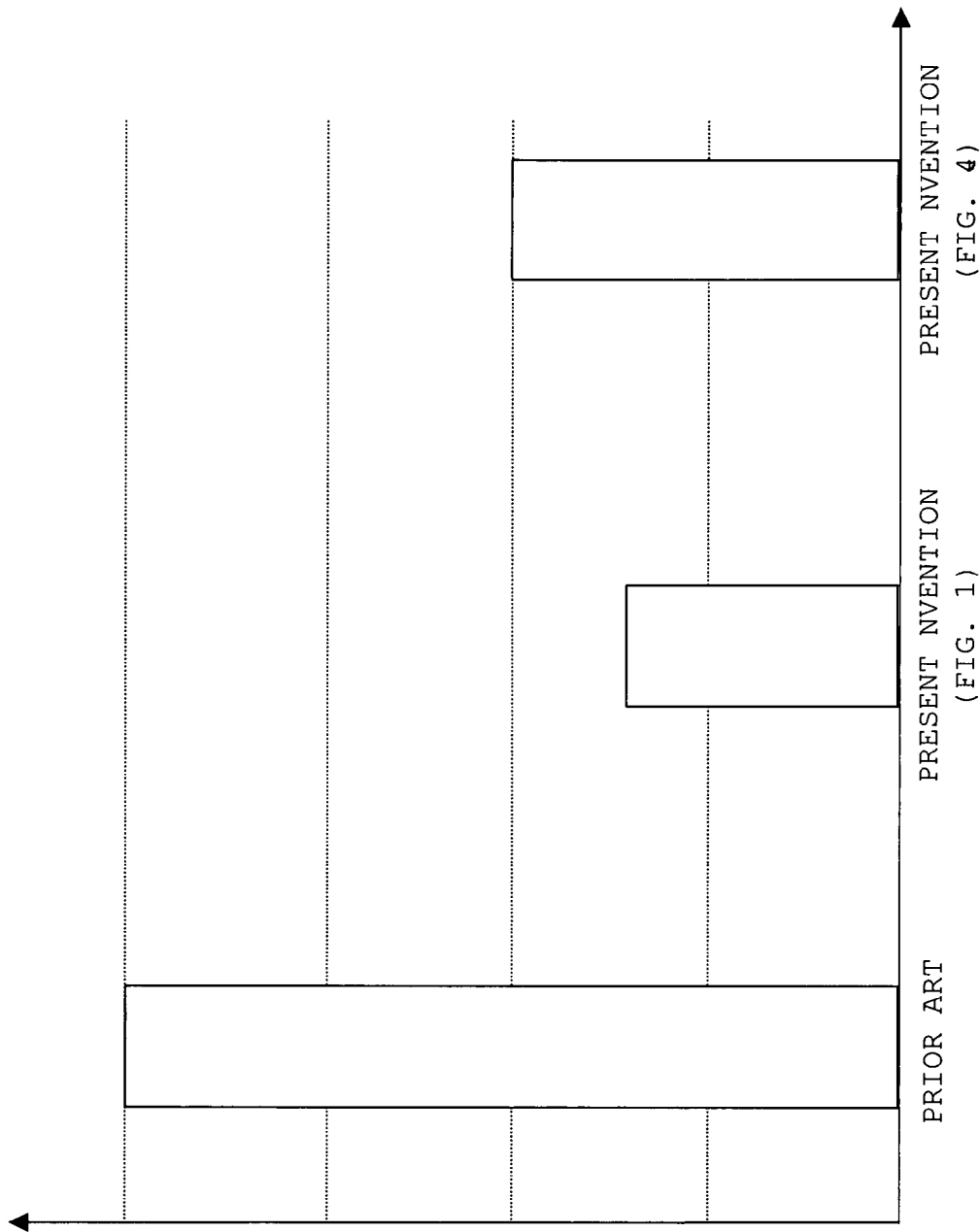
FIG. 7 is a diagram showing a result obtained when comparing a global level difference generated by using the methods according to the first and second embodiments of the present invention with the global level difference generated by using a conventional method.
Figure 8:
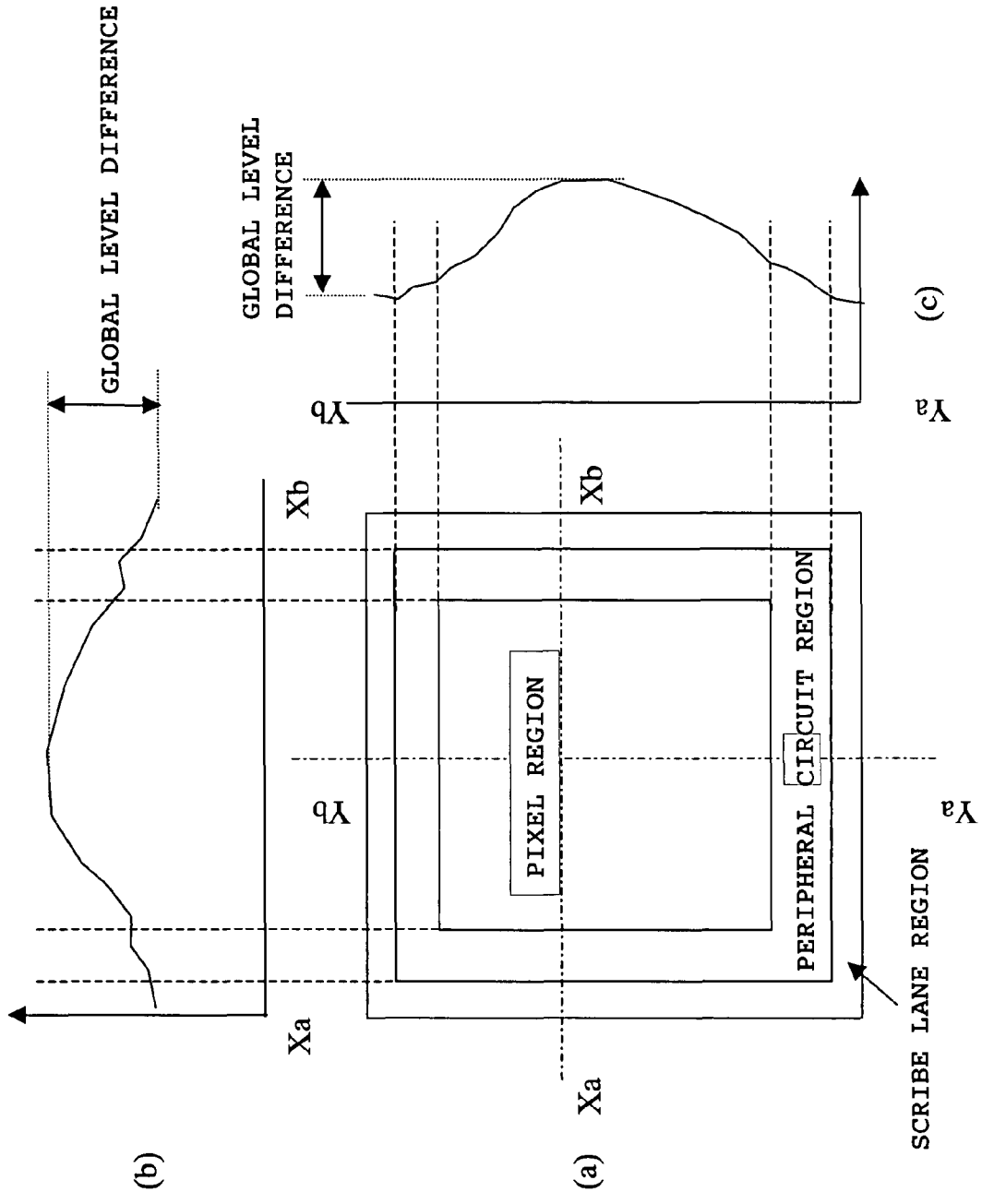
FIG. 8 is a diagram illustrating an exemplary global level difference of a conventional solid-state imaging device.
Figure 9:
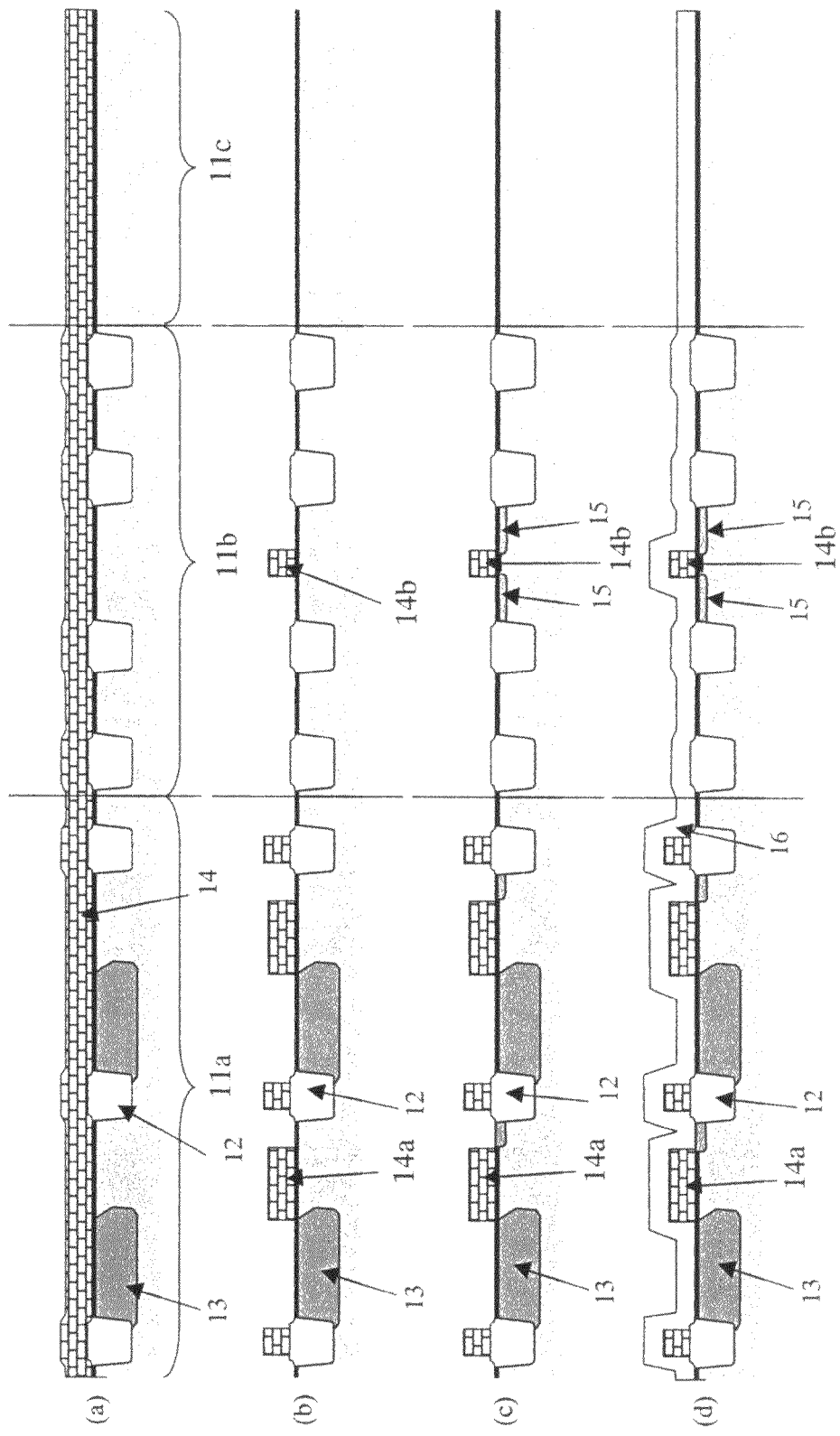
FIG. 9 is a cross-sectional view illustrating steps of a method for fabricating the conventional solid-state imaging device.

FIG. 7 shows a result obtained when comparing the global level difference generated by using the fabrication methods according to the first and second embodiments of the present invention with the global level difference generated by using a conventional fabrication method. The global level difference shown in FIG. 7 indicates a difference between a maximum value (max) and a minimum value (min) of the height of the surface of the interlayer insulation film included in the pixel region and the peripheral circuit region, after the CMP is performed on the surface thereof.

As shown in FIG. 7, it is apparent that when using the fabrication methods according to the first and second embodiments, the global level difference can be reduced as compared to when using the conventional fabrication method.

While the invention has been described in detail, the foregoing description is in all aspects illustrative and not restrictive. It is understood that numerous other modifications and variations can be devised without departing from the scope of the invention.

What is claimed is:

1. A method for fabricating a solid-state imaging device comprising, on a main surface of a semiconductor substrate, a pixel region, a peripheral circuit region located around a periphery of the pixel region, and a scribe lane region located around the periphery of the peripheral circuit region, the method comprising:
    a step of forming pixels in the pixel region;
    a step of forming a driving circuit for driving the pixels in the peripheral circuit region;
    a step of forming a photodiode protection insulation film for protecting a photodiode acting as a component of each of the pixels on the main surface of the semiconductor substrate;
    a step of forming a dummy protection insulation film corresponding to the photodiode insulation film both in the peripheral circuit region and the scribe lane region;
    a step of forming a dummy gate electrode, not functioning as a gate of a transistor, only in the scribe lane region;
    a step of forming an interlayer insulation film for covering three regions of the pixel region, the peripheral circuit region, and the scribe lane region; and
    a step of performing a CMP (Chemical Mechanical Polishing) on an entirety of a surface of the interlayer insulation film.

2. The method for fabricating the solid-state imaging device according to claim 1, wherein
    the step of forming the photodiode protection insulation film and the step of forming the dummy protection insulation film are performed in the same step.

3. The method for fabricating the solid-state imaging device according to claim 1, wherein
    the step of forming the dummy gate electrode is performed in the step of forming the driving circuit for driving the pixels in the peripheral circuit region.

4. The method for fabricating the solid-state imaging device according to claim 3, wherein
    the dummy protection insulation film and the dummy gate electrode cause the average heights of the surfaces of the interlayer insulation film included in at least any two of the three regions of the pixel region, the peripheral circuit region and the scribe lane region to be nearly equivalent to each other, before the CMP is performed on the entirety of the surface thereof.

5. A solid-state imaging device comprising, on a main surface of a semiconductor substrate, a pixel region, a peripheral circuit region located around a periphery of the pixel region, and a scribe lane region located around a periphery of the peripheral circuit region, the solid-state imaging device comprising:
    pixels formed in the pixel region;
    a driving circuit for driving the pixels in the peripheral circuit region;
    a photodiode protection insulation film, for protecting a photodiode acting as a component of each of the pixels, which is formed on the main surface of the semiconductor substrate;
    a dummy protection insulation film, corresponding to the photodiode protection insulation film, which is formed both in the peripheral circuit region and the scribe lane region;
    a dummy gate electrode, not functioning as a gate of a transistor, which is formed only in the scribe lane region; and
    an interlayer insulation film for covering three regions of the pixel region, the peripheral circuit region, and the scribe lane region.

6. The solid-state imaging device according to claim 5, wherein
    a material of the photodiode protection insulation film is the same as that of the dummy protection insulation film.

7. The solid-state imaging device according to claim 5, wherein
    a material of the dummy gate electrode is the same as that of a gate electrode in the peripheral circuit region.

8. The solid-state imaging device according to claim 7, wherein
    the dummy protection insulation film and the dummy gate electrode cause the average heights of the surfaces of the interlayer insulation film included in at least any two of the three regions of the pixel region, the peripheral circuit region and the scribe lane region to be nearly equivalent to each other, before the CMP is performed on the entirety of the surface thereof.

* * * * *